United States Patent
Mittal et al.

(10) Patent No.: US 9,930,769 B2
(45) Date of Patent: Mar. 27, 2018

(54) THERMAL METAL GROUND FOR INTEGRATED CIRCUIT RESISTORS

(71) Applicant: QUALCOMM Incorporated, San Diego, CA (US)

(72) Inventors: Arpit Mittal, San Diego, CA (US); Alvin Leng Sun Loke, San Diego, CA (US); Mehdi Saeidi, San Diego, CA (US); Patrick Drennan, Gilbert, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 154 days.

(21) Appl. No.: 14/181,187

(22) Filed: Feb. 14, 2014

(65) Prior Publication Data

US 2015/0237709 A1  Aug. 20, 2015

(51) Int. Cl.
*H01L 29/00* (2006.01)
*H05K 1/02* (2006.01)
*H01C 1/08* (2006.01)
*H01C 1/01* (2006.01)
*H01L 49/02* (2006.01)
*H01C 1/084* (2006.01)
*H01L 23/522* (2006.01)
*H01L 23/367* (2006.01)

(52) U.S. Cl.
CPC ............ *H05K 1/0204* (2013.01); *H01C 1/01* (2013.01); *H01C 1/08* (2013.01); *H01C 1/084* (2013.01); *H01L 23/367* (2013.01); *H01L 23/3677* (2013.01); *H01L 23/5228* (2013.01); *H01L 28/20* (2013.01)

(58) Field of Classification Search
CPC ... H01L 28/20; H01L 23/5228; H01L 23/367; H01L 2924/00; H01L 2924/0002; H01L 2924/00014; H01L 23/3677; H01C 1/084; H01C 7/1013
USPC .. 257/529, 536, E21.004, E23.105, E27.047
See application file for complete search history.

(56) References Cited

U.S. PATENT DOCUMENTS

| | | | |
|---|---|---|---|
| 7,898,032 B2 * | 3/2011 | Suzuki | H01L 27/0629 257/350 |
| 8,013,394 B2 | 9/2011 | Chinthakindi et al. | |
| 8,230,586 B2 | 7/2012 | Coolbaugh et al. | |
| 8,486,796 B2 | 7/2013 | Harmon et al. | |
| 2004/0056345 A1 * | 3/2004 | Gilleo | H01L 21/486 257/698 |
| 2005/0167801 A1 | 8/2005 | Kerr et al. | |
| 2006/0231945 A1 | 10/2006 | Chinthakindi et al. | |

(Continued)

OTHER PUBLICATIONS

Chung, Materials for thermal conduction, Jan. 31, 2001, Applied Thermal Engineering 21, (2001), 1593-1605.*

(Continued)

*Primary Examiner* — David Chen
(74) *Attorney, Agent, or Firm* — Loza & Loza LLP

(57) ABSTRACT

Metal thermal grounds are used for dissipating heat from integrated-circuit resistors. The resistors may be formed using a front end of line layer, for example, a titanium-nitride layer. A metal region (e.g., in a first metal layer) is located over the resistors to form a heat sink. An area of thermal posts connected to the metal region is also located over the resistor. The metal region can be connected to the substrate of the integrated circuit to provide a low impedance thermal path out of the integrated circuit.

17 Claims, 3 Drawing Sheets

(56) References Cited

U.S. PATENT DOCUMENTS

| | | | |
|---|---|---|---|
| 2010/0032770 A1 | 2/2010 | Park et al. | |
| 2011/0042820 A1* | 2/2011 | Knickerbocker | H01L 21/76898 |
| | | | 257/774 |
| 2011/0140279 A1 | 6/2011 | Anderson et al. | |
| 2011/0176278 A1* | 7/2011 | Park | H01L 23/3677 |
| | | | 361/712 |
| 2012/0002375 A1 | 1/2012 | Lin et al. | |
| 2012/0068308 A1 | 3/2012 | Igeta et al. | |
| 2012/0181663 A1* | 7/2012 | Lukaitis | H01L 28/20 |
| | | | 257/536 |
| 2014/0008764 A1* | 1/2014 | Yang | H01L 23/5228 |
| | | | 257/537 |

OTHER PUBLICATIONS

Anna M., et al., "TiN thin film resistors for monolithic microwave integrated circuits", Journal of Vacuum Science and Technology: Part B, Avsiaip, Melville, New York, NY, US, vol. 28, No. 5, Aug. 28, 2010 (Aug. 20, 2010), pp. 912-915, XP012144254, ISSN: 1071-1023, DOI: 10.1116/1.3475532 abstract.
International Search Report and Written Opinion—PCT/US2015/015041—ISA/EPO—dated Jun. 10, 2015.

\* cited by examiner

THERMAL METAL GROUND FOR INTEGRATED CIRCUIT RESISTORS

BACKGROUND

Field

The present invention relates to integrated circuits and, more particularly, to a thermal metal ground for cooling integrated circuit resistors.

Background

Some integrated-circuit resistors operate with high power dissipation. This leads to heating in the area of the resistor. The resulting increased temperature can impair the reliability of circuit elements in that area. For example, metal interconnect lines that are routed over the resistors could suffer from increased electromigration. Additionally, integrated circuit fabrication processes have scaled to smaller and smaller feature sizes. This leads to the possibility of increased power density and temperature rises in localized areas.

Resistors used for on-die termination (ODT) of inputs and outputs of an integrated circuit are an example of resistors that may have a high power dissipation. Some previous designs have lessened the temperature increase by making the resistors physically larger (increasing both the width and length of the resistor so that the electrical resistance is unchanged). Some previous designs have not used the area near the resistors for routing metal interconnects. Both of these approaches are undesirable as they result in a larger integrated circuit.

SUMMARY

Integrated-circuit resistors with metal thermal grounds are provided. The resistors may be formed using a front end of line (FEOL) layer, for example, a titanium-nitride layer. A metal region (e.g., in a first metal layer) is located over the resistors to form a heat sink. An area of thermal posts connected to the metal region is also located over the resistor. The metal region can be connected to the substrate of the integrated circuit to provide a low impedance thermal path out of the integrated circuit.

In one aspect, an integrated circuit is provided that includes: a resistor; a metal region disposed parallel to and overlapping at least part of the resistor; and one or more thermal posts electrically connected to the metal region and disposed between the metal region and the resistor, the thermal posts electrically isolated from the resistor.

In one aspect, a method for dissipating heat from a resistor in an integrated circuit is provided. The method includes: conducting heat from the resistor to a thermal metal ground using one or more thermal posts disposed between the thermal metal ground and the resistor; and conducting heat from the thermal metal ground to a substrate of the integrated circuit.

In one aspect, an integrated circuit is provided that includes: a resistor; a metal region disposed parallel to and overlapping at least part of the resistor; and means for conducting heat from the resistor to the metal region.

Other features and advantages of the present invention should be apparent from the following description which illustrates, by way of example, aspects of the invention.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

Figure 1:
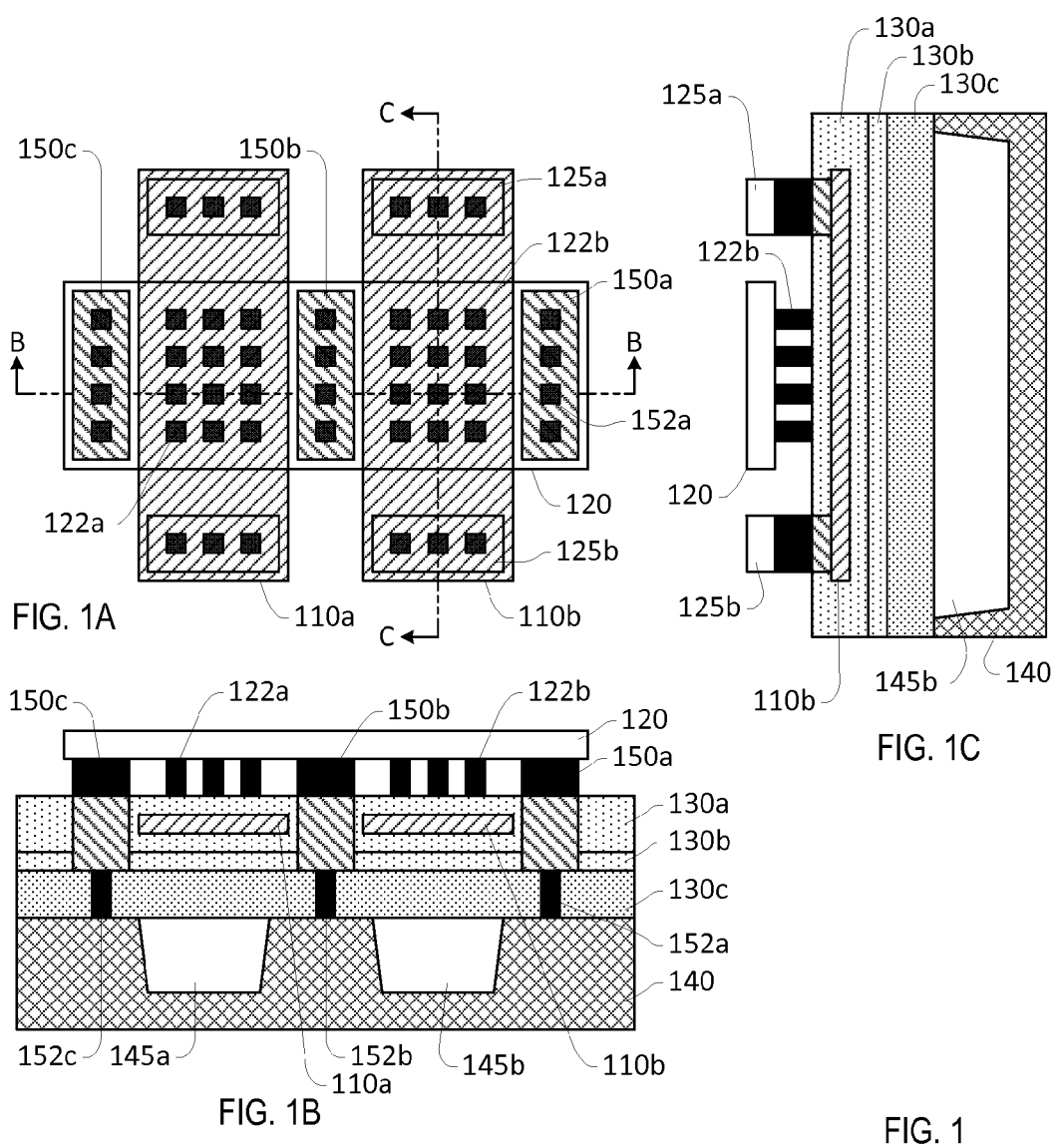
FIG. 1 illustrates resistors with a metal thermal ground according to a presently disclosed embodiment.

FIG. 1 illustrates an example layout of resistors with a metal thermal ground. FIG. 1A is a top view. This is the view commonly used for designing the layout of an integrated circuit. FIG. 1B is a cross-sectional view along line B-B. FIG. 1C is a cross-sectional view along line C-C. Like regions and layers are indicated with like references in the figures. Not all layers are shown. Additionally, regions are generally illustrated as rectangular, although the shapes may vary in a fabricated integrated circuit. The example is described for CMOS technology but may be used with other technologies. The arrangement of the particular layers can vary and the layers used can vary, for example, when different fabrication processes are used for the integrated circuit.

The example of FIG. 1 includes two resistors (110*a*, 110*b*). The resistors may be formed in a titanium-nitride layer. The resistors are connected to other circuitry, for example, via metal and contacts (125*a*, 125*b*) located at opposite ends of the resistors. The resistors (110*a*, 110*b*) are surrounded by a dielectric 130*a*. In addition to being an electrical insulator, the dielectric 130*a* is a poor thermal conductor.

A thermal metal region 120 is located over the resistors. The thermal metal region 120 provides a heat sink for the resistors (110*a*, 110*b*). Local heating of the thermal metal region 120 does not pose a reliability issue, since the thermal metal region 120 does not carry electrical current and, thus, is not susceptible to electromigration. The thermal metal region 120 may be formed in the first metal layer (the metal layer closest to the substrate of the integrated circuit). The first metal layer is often referred to as "M1" and is also used to route signal interconnects between components on the integrated circuit. The signal interconnects may use other metal layers as well; for example, a transistor in one area of the integrated circuit may be connected to the first metal layer and then connected to higher metal layers and routed to a second area of the integrated circuit where the higher metal layers are again connected to the first metal layer which is connected to a transistor in the second area of the integrated circuit. The thermal metal region 120 may be, for example, formed of copper and other metals.

The thermal metal region 120, in the embodiment of FIG. 1, is connected to the substrate 140 of the integrated circuit.

The thermal metal region 120 is connected to the substrate 140 at locations between isolation regions (145a, 145b) in the substrate 140. The connections may be, for example, to p-diffusion regions when the substrate is p-type. The connections are through contacts (150a, 152a, 150b, 152b, 150c, 152c) located in contact openings in dielectric layers (130a, 130b, 130c). The contacts are formed of an electrical conductor, such as tungsten, which is also a good thermal conductor. The thermal metal region 120, in the embodiment of FIG. 1, is ohmically connected to the substrate 140 via the contacts and p-diffusion regions. The thermal metal region 120 may alternatively be connected to the substrate without an ohmic contact, for example, using n-diffusion regions in the p-type substrate which form a diode contact. The thermal metal region 120 may alternatively be thermally connected to the substrate without an electrical connection between the thermal metal region 120 and the substrate 140, for example, by using it an intervening material such as beryllia, which is an electrical insulator with high thermal conductivity. The particular arrangement of contacts and dielectric layers may differ for different process nodes. The connection between the thermal metal region 120 and the substrate 140 can be the same as the type of connection, for example, used between a first metal layer regions and a source-drain region elsewhere on the integrated circuit. The thermal metal region 120 is surrounded by dielectric layers (not shown in FIG. 1).

In addition to being an electrical conductor, the thermal metal region 120 is a good thermal conductor. Thus, the thermal metal region 120 can provide a path with low thermal resistance for dissipating heat from the resistors (110a, 110b). Connecting the thermal metal region 120 to the substrate 140 can further reduce the thermal resistance for dissipating heat from the resistors (110a, 110b) as the substrate 140 can have a low thermal resistance path for dissipating heat, for example, via connection to metal in an integrated circuit package.

An array of thermal posts (122a, 122b) is located in a layer between the thermal metal region 120 and the resistors (110a, 110b). The thermal posts (122a, 122b) may include, for example, tungsten or other metals. The thermal posts and openings for the thermal posts may be formed by methods similar to those used for forming contacts and contact openings between the first metal layer and source/drain regions in the substrate of the integrated circuit. The openings for the thermal posts (122a, 122b) may be formed, for example, by selective etching between different dielectric materials or by a timed etch. The thermal posts (122a, 122b) are connected to the thermal metal region 120 and extend toward the resistors (110a, 110b). The thermal posts (122a, 122b) do not contact the resistors (110a, 110b). Portions of the dielectric 130a separate the thermal posts (122a, 122b) from the resistors (110a, 110b).

The thermal posts (122a, 122b) are good thermal conductors. In particular, the thermal posts (122a, 122b) are much better thermal conductors than the dielectric layers. Thus, the thermal resistance of dissipating heat from the resistors (110a, 110b) is reduced by the proximity of the thermal posts (122a, 122b) to the resistors (110a, 110b).

Figure 2:
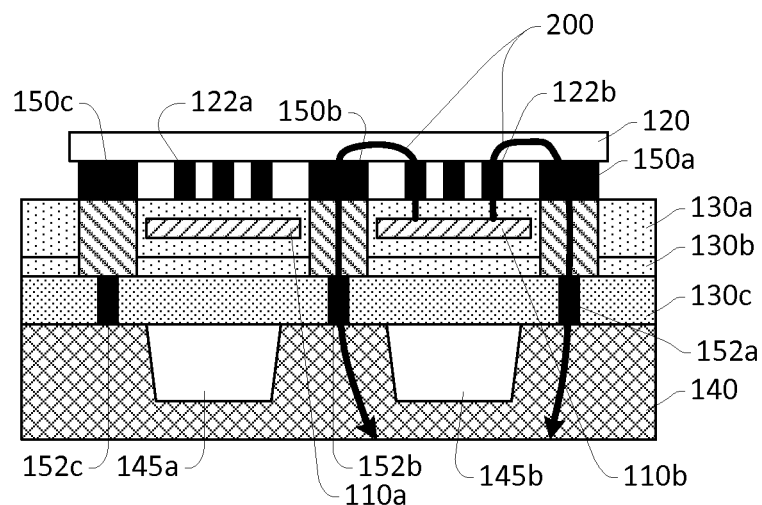
FIG. 2 illustrates heat transfer paths for the resistors and the thermal metal ground of FIG. 1.
Figure 3:
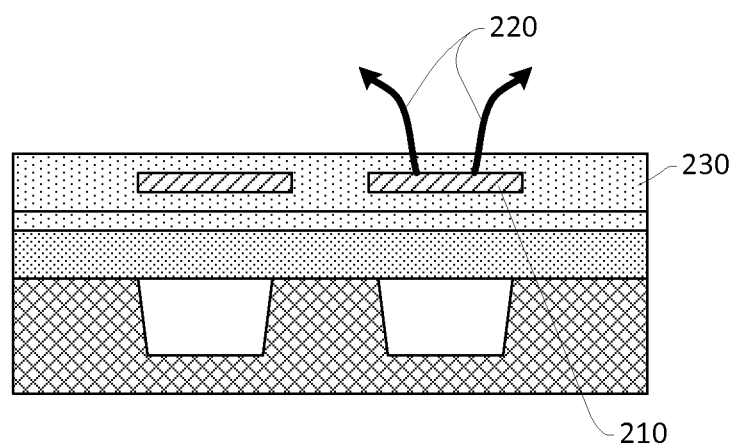
FIG. 3 illustrates heat transfer paths for resistors without a thermal metal ground.

FIG. 2 illustrates heat transfer paths 200 for the resistors and the thermal metal ground of FIG. 1. FIG. 3 illustrates heat transfer paths for a resistor 210 without a thermal metal ground. The thermal metal region 120 and thermal posts (122a, 122b) can substantially (e.g., 25%) lower the thermal impedance seen by the resistors. Qualitatively, this can be understood by comparing the heat transfer paths 200 illustrated in FIG. 2 with the heat transfer paths 220 illustrated in FIG. 3. The heat transfer paths 220 without a thermal metal ground are generally through dielectric layers (e.g., dielectric 230 and other dielectric layers above the resistor or the dielectric 230 and other dielectric layers below the resistor). The heat transfer paths 200 with the thermal metal ground are generally through metal and silicon layers (e.g., the thermal posts (122a, 122b), the thermal metal region 120, the contacts (150a, 152a, 150b, 152b), and the substrate 140). The metal layers and the silicon substrate are good thermal conductors and the dielectric layers are poor thermal conductors, thus the thermal path through the metal and substrate is less resistive than the path through the dielectrics.

Figure 4:
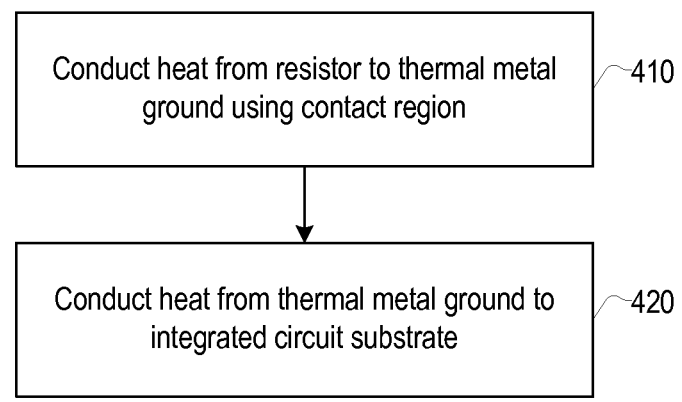
FIG. 4 is a flowchart of a process for dissipating heat from integrated circuit resistors.

FIG. 4 is a flowchart illustrating a method for dissipating heat from a resistor in an integrated circuit according to a presently disclosed embodiment. The process of FIG. 4 may be performed with various integrated circuits; however, to provide a specific example, the method will be described with reference to FIG. 1.

In step 410, heat is conducted from the resistor to a thermal metal ground using one or more thermal posts. The thermal posts are disposed between the thermal metal ground and the resistor. For example, heat can be conducted from the resistor 110a to the thermal metal region 120 using the thermal posts 122a.

In step 410, heat is conducted from the thermal metal ground to a substrate of the integrated circuit. For example, heat can be conducted from the thermal metal region 120 to the substrate 140 using the contacts 150b, 152.

The process of FIG. 4 may be modified, for example, by adding, omitting, reordering, or altering steps. Additionally, the steps may be performed concurrently.

Although embodiments of the invention are described above for particular embodiments, many variations of the invention are possible including, for example, those with different numbers of resistors, thermal posts, and thermal metal regions. The shapes and locations of the various elements can also be varied. In the illustrated embodiment, the thermal metal region and resistors only partially overlap since the thermal metal region is formed in the first metal layer which is also used to connect to the resistors. Other embodiments may use different layers and have full overlap between the thermal metal region and resistors.

Directional terms, such above, above, below, left, and right, are used to describe some features. This terminology is used to provide clear and concise descriptions. The terms are relative and no particular absolute orientation should be inferred. Additionally, features of the various embodiments may be combined in combinations that differ from those described above.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. An integrated circuit, comprising:
a first resistor;
a second resistor;
a metal region disposed parallel to and overlapping at least parts of the first and second resistors, wherein the metal region is thermally connected to a substrate of the integrated circuit via first, second, and third sets of contacts, wherein the second set of contacts is situated between the first and second resistors, wherein the first resistor is situated between the first and second sets of contacts, and wherein the second resistor is situated between the second and third sets of contacts;
a first two-dimensional array of thermal posts electrically connected to the metal region and disposed between the metal region and overlapping the first resistor, the first two-dimensional array of thermal posts electrically isolated from the first resistor; and
a second two-dimensional array of thermal posts electrically connected to the metal region and disposed between the metal region and overlapping the second resistor, the second two-dimensional array of thermal posts electrically isolated from the second resistor, wherein rows of the first two-dimensional array of thermal posts are aligned with rows of the second two-dimensional array of thermal posts, and wherein the first, second, and third sets of contacts comprise first, second, and third one-dimensional array of contacts, wherein the one-dimensional array of contacts are aligned with the rows of the first and second two-dimensional arrays of thermal posts;
first and second sets of resistor contacts electrically coupled to the first resistor; and
third and fourth sets of resistor contacts electrically coupled to the second resistor, wherein the first and second sets of resistor contacts comprise first and second one-dimensional arrays of resistor contacts, wherein the resistor contacts of the first and second one-dimensional arrays are aligned with columns of the first two-dimensional array of thermal posts, wherein the third and fourth sets of resistor contacts comprise third and fourth one-dimensional arrays of resistor contacts, wherein the resistor contacts of the third and fourth one-dimensional arrays are aligned with columns of the second two-dimensional array of thermal posts.

2. The integrated circuit of claim 1, wherein the first and second resistors are formed of titanium nitride.

3. The integrated circuit of claim 1, wherein the metal region is formed in a lowest metal layer of the integrated circuit.

4. The integrated circuit of claim 1, wherein the metal region is disposed above the first and second resistors.

5. The integrated circuit of claim 1 wherein the first and second resistors are surrounded by a dielectric.

6. A method for dissipating heat from first and second resistors in an integrated circuit, the method comprising:
providing a metal region disposed parallel to and overlapping at least parts of the first and second resistors;
conducting heat from the first resistor to the metal region using a first two-dimensional array of thermal posts disposed between the metal region and the first resistor, the first two-dimensional array of thermal posts electrically isolated from the first resistor;
conducting heat from the second resistor to the metal region using a second two-dimensional array of thermal posts disposed between the metal region and the second resistor, the second two-dimensional array of thermal posts electrically isolated from the second resistor, wherein rows of the first two-dimensional array of thermal posts are aligned with rows of the second two-dimensional array of thermal posts;
conducting heat from the metal region to a substrate via first, second, and third sets of contacts, wherein the second set of contacts is situated between the first and second resistors, wherein the first resistor is situated between the first and second sets of contacts, and wherein the second resistor is situated between the second and third sets of contacts, wherein the first, second, and third sets of contacts comprise first, second, and third one-dimensional array of contacts, wherein the one-dimensional array of contacts are aligned with the rows of the first and second two-dimensional arrays of thermal posts;
connecting the first resistor to circuitry via first and second sets of resistor contacts electrically coupled to the first resistor; and
connecting the second resistor to circuitry via third and fourth sets of resistor contacts electrically coupled to the second resistor, wherein the first and second sets of resistor contacts comprise first and second one-dimensional arrays of resistor contacts, wherein the resistor contacts of the first and second one-dimensional arrays are aligned with columns of the first two-dimensional array of thermal posts, wherein the third and fourth sets of resistor contacts comprise third and fourth one-dimensional arrays of resistor contacts, wherein the resistor contacts of the third and fourth one-dimensional arrays are aligned with columns of the second two-dimensional array of thermal posts.

7. The method of claim 6, wherein the first and second two-dimensional arrays of thermal posts are electrically connected to the metal region.

8. The method of claim 6, wherein the metal region is electrically connected to the substrate of the integrated circuit.

9. The method of claim 6, wherein the first and second resistors are formed of titanium nitride.

10. The method of claim 6, wherein the metal region is formed in a metal layer closest to the substrate of the integrated circuit.

11. The method of claim 6, wherein the first and second resistors are surrounded by a dielectric.

12. An integrated circuit, comprising:
a first resistor;
a second resistor;
a metal region disposed parallel to and overlapping at least parts of the first and second resistors;
means for conducting heat from the first resistor to the metal region, wherein the means for conducting heat includes a first two-dimensional array of thermal posts disposed between the metal region and the first resistor, the first two-dimensional array of thermal posts electrically isolated from the first resistor;
means for conducting heat from the second resistor to the metal region, wherein the means for conducting heat includes a second two-dimensional array of thermal posts disposed between the metal region and the second resistor, the second two-dimensional array of thermal posts electrically isolated from the second resistor, wherein rows of the first two-dimensional array of thermal posts are aligned with rows of the second two-dimensional array of thermal posts;

first, second, and third means for thermally connecting the metal region to a substrate, wherein the second thermally connecting means is situated between the first and second resistors, wherein the first resistor is situated between the first and second thermally connecting means, and wherein the second resistor is situated between the second and third thermally connecting means, wherein the first, second, and third thermally connecting means comprise first, second, and third one-dimensional array of contacts, wherein the one-dimensional array of contacts are aligned with the rows of the first and second two-dimensional arrays of thermal posts;

means for electrically connecting circuitry to the first resistor including first and second sets of resistor contacts electrically coupled to the first resistor; and means for electrically connecting circuitry to the second resistor including third and fourth sets of resistor contacts electrically coupled to the second resistor, wherein the first and second sets of resistor contacts comprise first and second one-dimensional arrays of resistor contacts, wherein the resistor contacts of the first and second one-dimensional arrays are aligned with columns of the first two-dimensional array of thermal posts, wherein the third and fourth sets of resistor contacts comprise third and fourth one-dimensional arrays of resistor contacts, wherein the resistor contacts of the third and fourth one-dimensional arrays are aligned with columns of the second two-dimensional array of thermal posts.

13. The integrated circuit of claim 12, wherein the first and second two-dimensional array of thermal posts are electrically connected to the metal region.

14. The integrated circuit of claim 12, wherein the first and second resistors are formed of titanium nitride.

15. The integrated circuit of claim 12, wherein the metal region is formed in a lowest metal layer of the integrated circuit.

16. The integrated circuit of claim 12, wherein the metal region is disposed above the first and second resistors.

17. The integrated circuit of claim 12, wherein the first and second resistors are surrounded by a dielectric.

* * * * *